United States Patent
Gelinck et al.

(10) Patent No.: US 7,829,884 B2
(45) Date of Patent: Nov. 9, 2010

(54) NON-VOLATILE FERROELECTRIC THIN FILM DEVICE USING AN ORGANIC AMBIPOLAR SEMICONDUCTOR AND METHOD FOR PROCESSING SUCH A DEVICE

(75) Inventors: Gerwin Hermanus Gelinck, Eindhoven (NL); Albert W. Marsman, Eindhoven (NL); Fredericus Johannes Touwslager, Eindhoven (NL); Dagobert Michel De Leeuw, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 237 days.

(21) Appl. No.: 10/584,039

(22) PCT Filed: Dec. 1, 2004

(86) PCT No.: PCT/IB2004/052613

§ 371 (c)(1),
(2), (4) Date: Jun. 1, 2007

(87) PCT Pub. No.: WO2005/064614

PCT Pub. Date: Jul. 14, 2005

(65) Prior Publication Data

US 2007/0252137 A1    Nov. 1, 2007

(30) Foreign Application Priority Data

Dec. 22, 2003    (EP)    ................................ 03104889

(51) Int. Cl.
*H01L 35/24*    (2006.01)

(52) U.S. Cl. .................... 257/40; 257/E21.255; 438/99
(58) Field of Classification Search .................. 257/40, 257/E21.255; 438/99
See application file for complete search history.

(56) References Cited

U.S. PATENT DOCUMENTS

| | | | |
|---|---|---|---|
| 6,815,711 B2 * | 11/2004 | Geens et al. | 257/40 |
| 6,905,906 B2 * | 6/2005 | Sirringhaus et al. | 438/99 |
| 2003/0127676 A1 | 7/2003 | Redecker | |
| 2005/0151176 A1 * | 7/2005 | Gudesen et al. | 257/295 |

FOREIGN PATENT DOCUMENTS

JP    04180261 A    6/1992

OTHER PUBLICATIONS

G.H. Gelinck, "High-performance all-polymer integrated circuits", Applied Physics Letters, vol. 77, No. 10, Sep. 4, 2000, pp. 1487-1489.

F.J. Touwslager et al, "I-Line lithography of poly-(3,4-ethylenedioxythiophene) electrodes and application in all-polymer integrated circuits", Applied Physics Letters, vol. 81, No. 24, Dec. 9, 2002, pp. 4556-4558.

* cited by examiner

*Primary Examiner*—Wael M Fahmy
*Assistant Examiner*—John C Ingham (57) ABSTRACT

A non-volatile ferroelectric memory device is proposed which comprises a combination of an organic ferroelectric polymer with an organic ambipolar semiconductor. The devices of the present invention are compatible with—and fully exploit the benefits of polymers, i.e. solution processing, low-cost, low temperature layer deposition and compatibility with flexible substrates.

19 Claims, 5 Drawing Sheets

NON-VOLATILE FERROELECTRIC THIN FILM DEVICE USING AN ORGANIC AMBIPOLAR SEMICONDUCTOR AND METHOD FOR PROCESSING SUCH A DEVICE

The present invention relates to non-volatile ferroelectric memory devices and methods of making the same, which may, for example, be compatible with polymer processing methods. More in particular, the present invention relates to non-volatile ferroelectric memory devices comprising a combination of a ferroelectric polymer-insulating layer with an organic ambipolar semiconductor.

Memory technologies can be broadly divided into two categories: volatile and non-volatile. Volatile memories, such as SRAM (Static Random Access Memory) and DRAM (Dynamic Random Access Memory), lose their contents when power is removed while non-volatile memories, which are based on ROM (Read Only Memory) technology, do not. DRAM, SRAM and other semiconductor memories are widely used for the processing and high-speed storage of information in computers and other devices. In recent years EEPROMs and Flash Memory have been introduced as non-volatile memories that store data as electrical charges in floating-gate electrodes. Non-volatile memories (NVMs) are used in a wide variety of commercial and military electronic devices and equipment, such as e.g. hand-held telephones, radios and digital cameras. The market for these electronic devices continues to demand devices with a lower voltage, lower power consumption and a decreased chip size. EEPROMs and Flash Memory, however, take long time to write data, and have limits on the number of times that data can be rewritten.

As a way to avoid the shortcomings of the types of memory described above, ferroelectric random access memories (FRAMs), which store data by the electrical polarization of a ferroelectric film, were suggested. There are two types of memory operation principles for ferroelectric memories. A first type is detecting the amount of stored electric charges i.e. the differential between the polarization switching charge current and the polarization non-switching charge current (FRAM). A second type is detecting the difference of the FET channel conductance (FET). This channel conductance is modified by the polarization direction of the ferroelectric film on the FET channel region. Ferroelectric non-volatile memories are attractive, since they have unchallenged performance advantages over current technologies (EEPROM, flash), such as higher write endurance, lower write voltage, non-destructive reading and lower power consumption.

Ferroelectric materials are characterized by spontaneous polarization in the absence of an electric field, that is reversible upon application of an electric field lower than the breakdown field. Spontaneous polarization in a ferroelectric material arises from a non-centrosymmetric arrangement of ions or polar molecules in its unit cell that produces an electric dipole moment.

When an alternating electric field is applied to a ferroelectric material the polarization shows a hysteresis behavior with the applied field. In an initial stage, ferroelectric domains that are oriented favorably with respect to the applied field direction grow at the expense of other domains. This continues until total domain growth and reorientation have occurred. At this stage, the material has reached its saturation polarization ($P_s$) If the electric field is then removed, some of the domains do not return to their random configurations and orientations. The polarization at this stage is called the remnant polarization ($P_r$). The strength of the electric field required to return the polarization to zero is the coercive field ($E_c$).

Figure 1:
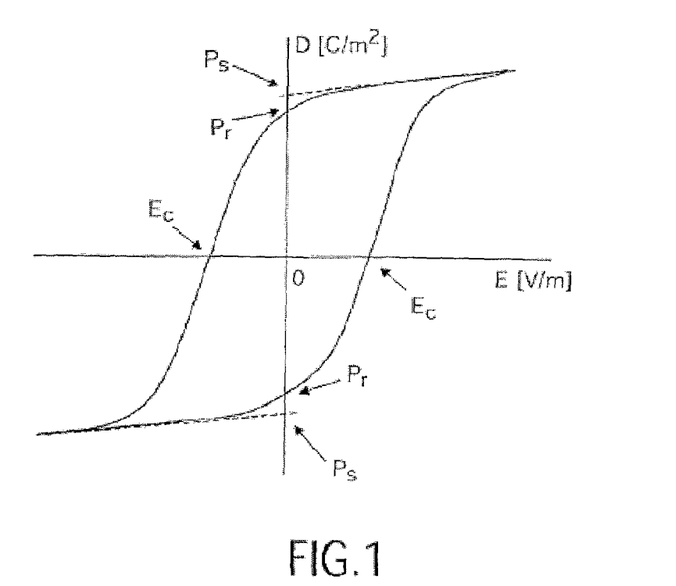
FIG. 1 shows a graph illustrating surface charge density D on a capacitor versus an applied electric field E. (ref.: M. E. Lines and A. M. Glass in 'Principles and Applications of Ferroelectrics and Related Materials)

A typical ferroelectric hysteresis loop is illustrated in FIG. 1, showing surface charge density D in function of applied electric field E. At zero applied field E=0, there are two states of polarization, $\pm P_r$. Furthermore, these two states of polarization are equally stable. Either of these two states could be encoded as a "1" or "0" and since no external field is required to maintain these states, the memory device is non-volatile. To switch the state of the device, a threshold field with an absolute value larger than $E_c$ is required. In order to reduce the threshold field $E_c$ for a given ferroelectric material, the ferroelectric material needs to be processed in the form of thin films (preferably with a thickness less than 2 micron).

The ferroelectric film on the memory cell capacitor may be made of inorganic materials such as: barium titanate (BaTiO$_3$), lead zirconate titanate (PZT—Pb(Zr, Ti)O$_3$)), PLZT ((Pb,La)(Zr,Ti)O$_3$)) or SBT (SrBi$_2$Ta$_2$O$_9$), or of organic molecular materials such as: triglycine sulphate (TGS) or organic polymers and oligomers with polar groups such as e.g. odd numbered nylons, polyvinylidene cyanide p(VCN) or polyvinylidenefluoride (p(VDF). From the polymers known to date, especially a group of fluorine containing materials, to which p(VDF) having the chemical structure (CH$_2$—CF$_2$)$_n$ belongs, is preferred due to advantageous properties, such as: high remnant polarization and relatively low coercive field in films obtained directly form spincoating. Especially materials with combinations of VDF (CH$_2$—CF$_2$), with TrFE (CHF—CF$_2$) and/or TFE (CF$_2$—CF$_2$) such as for example the random copolymers (CH$_2$—CF$_2$)$_n$—(CHF—CF$_2$)$_m$ or (CH$_2$—CF$_2$)$_n$—(CF$_2$—CF$_2$)$_m$ have excellent ferroelectric and film forming properties. It is further noted here that in general any material that has a crystalline phase with a crystal structure belonging to an asymmetric space group could possess ferroelectric properties as long as the electrical breakdown field is higher than the required switching field (related to coercive field).

However, in case of ferroelectric liquid crystalline polymers for example, which are being used for, for example, displays, the remnant polarization $P_r$ is generally low (~5-10 mC/m$^2$), being dependent on a dipole moment from a large molecule. This may be too low for memory applications. In addition, operating conditions will be very temperature sensitive due to the liquid crystal properties. For memory application one likes to have stable properties at temperatures in between approximately −20 to 150 C. Therefore, in case of non-volatile memory cells, preferably the aforementioned non-liquid crystalline organic ferroelectric materials are used as a ferroelectric layer.

Figure 2:
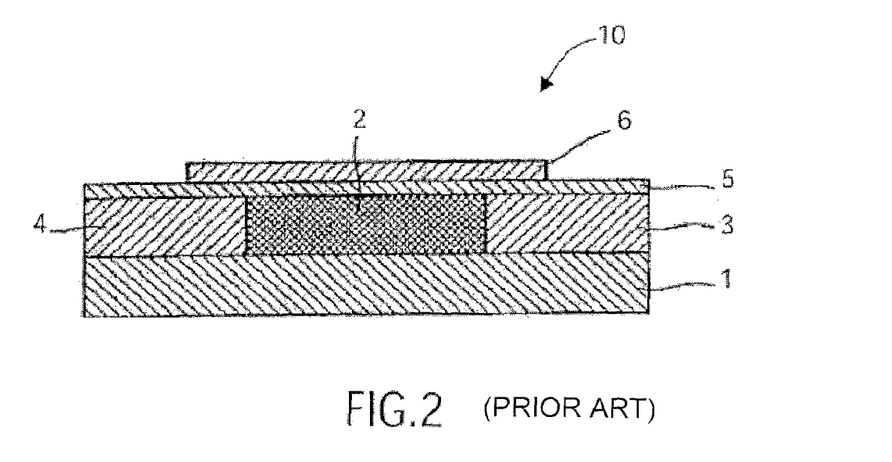
FIG. 2 shows a non-volatile memory device according to the prior art.

In US 2003/0127676 a non-volatile memory device 10 is described, including a substrate 1, an active layer 2, a drain 3, a source 4, a gate insulating layer 5 and a gate 6. The active layer 2 is formed of an organic semiconductor in a contact region between the source 4 and the drain 3. The gate-insulating layer 5 is formed of a ferroelectric material and is deposited onto the active layer 2, and the gate 6 is formed on top of the gate-insulating layer 5. The device 10 of this document is illustrated in FIG. 2. Since the non-volatile memory device 10 includes a ferroelectric gate insulating layer 5 and an organic semiconductor active layer 2, it is very flexible, light-weight, multi-programmable and can be easily manufactured.

However, devices 10 having a unipolar organic semiconductor active layer 2, only function in accumulation or depletion. Those devices 10 do not function in inversion. For ferroelectric transistor applications this implies that only for one polarization direction of the ferroelectric accumulation charge density compensates for the polarization. For the opposite polarization direction the semiconductor is depleted and hence compensation charge density must be present as space charges, i.e. the semiconductor must have sufficient background doping to be able to sustain this polarization induced charge density. However, in order to not deteriorate the transfer characteristics of organic transistors, the semiconductors used, by their nature, do not comprise doping. Nevertheless they generally comprise impurities introduced during synthesis or handling and are often unintentionally doped. This unintentional doping apparently is able to facilitate some switching and provide some stabilization of the involved gate polarization state. This operation principle is however undesirable from a transistor quality and technological point of view since unintentional doping is not controllable and in fact undesirable. In addition, unintentional doping mainly consists of ionic species or polar small molecules (space charge) that can be transported through the gate dielectric either under influence of the electric fields employed during device operation or that can move after writing a certain polarization state thereby causing imprint, fatigue or other degradation phenomena often encountered in ferroelectric memory devices.

It is an object of the present invention to provide non-volatile ferroelectric memory devices, which can be obtained by low-cost processing and at low temperatures, which are compatible with flexible substrates and which solve the charge stabilization problem of the prior art devices.

The above objective is accomplished by a method and device according to the present invention.

The present invention provides a non-volatile memory device comprising an organic ambipolar semiconductor layer and an organic ferroelectric layer. The organic ambipolar semiconductor layer and the organic ferroelectric layer are at least partially in contact with each other.

In one embodiment of the present invention, the device may comprise a control electrode, which may be formed in a first conductive layer. The first conductive layer may for example be a metal (e.g. indium Tin Oxide (ITO), gold), or a conductive polymer layer (e.g. PEDOT/PSS). The control electrode may be separated from the organic ambipolar semiconductor layer by the organic ferroelectric layer.

The device according to the present invention may furthermore comprise a first and a second main electrode. The first and second main electrode may be formed in a second conductive layer. The second conductive layer may for example be a metal (e.g. ITO, gold), or a conductive polymer layer (e.g. PEDOT/PSS). The control electrode may be separated from the organic ambipolar semiconductor layer by the organic ferroelectric layer. The first and second main electrode may be separated from each other by material of the organic ambipolar semiconductor layer and may be separated from the control electrode by the organic ferroelectric layer.

In one embodiment of the invention the organic ferroelectric layer may be a ferroelectric fluorinated polymer or oligomer layer and may for example comprise material selected from $(CH_2-CF_2)_n$, $(CHF-CF_2)_n$, $(CF_2-CF_2)_m$ or combinations thereof to form (random) copolymers like: $(CH_2-CF_2)_n-(CHF-CF_2)_m$ or $(CH_2-CF_2)_n-(CF_2-CF_2)_m$.

The organic ambipolar semiconductor layer, used in the invention, may for example comprise a mixture of an n-type and a p-type semiconductor material, such as for example a mixture of [6,6]-phenyl-C61-butyricacid methylester and poly[2-methoxy,5-(3,7)dimethyl-octyloxy]-p-phenylene vinylene.

In another embodiment of the present invention, the organic ambipolar semiconductor layer may comprise a single organic material, such as for example poly(3,9-di-tert-butylindeno[1,2-b]fluorene).

Furthermore, the organic ambipolar semiconductor layer may be a double layer-stack of p-type and n-type semiconductors, wherein two active semiconductors may be used. The non-volatile memory device of the present invention may comprise a memory window, whereby the memory window may depend on the ratio of electron current and hole current. In one embodiment, the ratio of electron current and hole current may be close to 0 or may be close to 1. In that case, the memory window may be largest.

The present invention furthermore provides a method for processing a non-volatile memory device. The method comprises:

forming an organic ferroelectric layer and
forming an organic ambipolar semiconductor layer, the organic ambipolar semiconductor layer and the organic ferroelectric layer being at least partially in contact with each other. The organic ferroelectric layer may for example be a ferroelectric fluorinated polymer or oligomer layer and may for example comprise material selected from $(CH_2-CF_2)_n$, $(CHF-CF_2)_n$ $(CF_2-CF_2)_m$ or combinations thereof to form (random) copolymers like: $(CH_2-CF_2)_n-(CHF-CF_2)_m$ or $(CH_2-CF_2)_n-(CF_2-CF_2)_m$. The organic ambipolar semiconductor layer may be a mixture of an n-type and a p-type semiconductor material and may for example be a mixture of [6,6]-phenyl-C61-butyricacid methylester and poly[2-methoxy,5-(3,7)-dimethyl-octyloxy]-p-phenylenevinylene. In another embodiment, the organic ambipolar semiconductor layer may be a single organic material such as for example poly(3,9-di-tert-butylindeno[1,2-b]-fluorene). Furthermore, the organic ambipolar semiconductor layer may be a double layer-stack of p-type and n-type semiconductors, wherein two active semiconductors may be used.

The method of the present invention may furthermore comprise forming a control electrode from a first conductive layer. The first conductive layer may for example be a metal (e.g. ITO, gold), or a conductive polymer layer (e.g. PEDOT/PSS).

In one embodiment of the invention, the method may furthermore comprise forming a first main electrode and a second main electrode from a second conductive layer. The second conductive layer may for example be a metal (e.g. ITO, gold), or a conductive polymer layer (e.g. PEDOT/PSS). The first and second main electrode may be separated from each other by material of the organic ambipolar semiconductor and may be separated from the control electrode by the organic ferroelectric layer.

The method of the invention may furthermore comprise patterning of the organic ambipolar semiconductor layer.

Advantages of the device of the present inventions are that it can be made by means of solution processing and hence low-cost processing can be achieved. Another advantage of the present invention is that the different layers, necessary to form the device, can be deposited at low temperature. A further advantage of this invention is the compatibility with flexible substrates.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In FIGS. 3-4 and 6-7 subsequent steps in the processing of a non-volatile ferroelectric memory device according to an embodiment of the present invention are illustrated.

Figure 3:
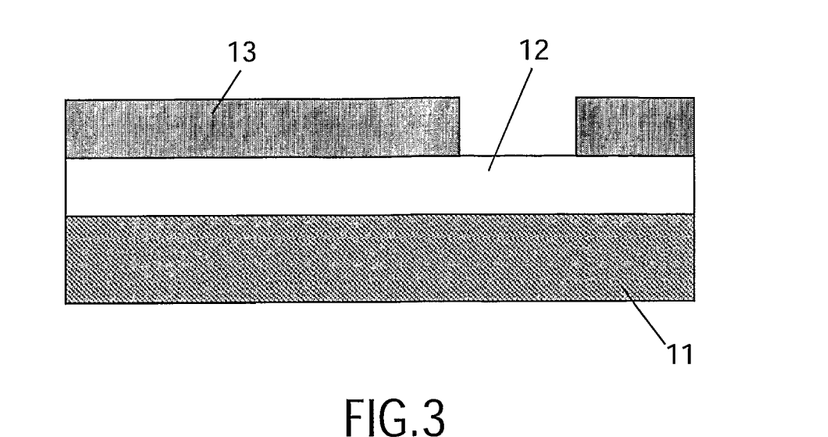
FIGS. 3-4 and 6-7 illustrate subsequent steps in the processing of a non-volatile ferroelectric memory element according to an embodiment of the present invention.

In a first step, a substrate 11 may optionally be planarized by for example deposition of a planarization layer 12, which may for example be an epoxy- or novolac-based polymer, onto the substrate 11 (FIG. 3).

In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass, plastic or metal layer. The planarisation layer 12 may be deposited onto the substrate 11 by means of for example spincoating. After optional planarisation of the substrate 11, a first conductive layer is deposited onto the planarisation layer 12 or, in case the substrate 11 has not been planarised, onto the substrate 11 by any suitable technique, for example by means of spincoating, drop casting, Doctor Blade, lamination of a prefabricated composite film, spraying or printing. The first conductive layer may for example be a metal layer (e.g. gold, ITO), a conductive polymer layer (e.g. polyaniline doped with camphor sulfonic acid (PANI/CSA) or poly(3,4-ethylenedioxythiophene) doped with poly(4-styrenesulfonaat) (PEDOT/PSS)) or any other suitable conductive material layer. The thickness of the first conductive layer to be used depends on the required sheet resistance for the application envisioned and the specific resistance of the material that is used. The first conductive layer may have a thickness of for example 100 nm and lower, e.g. in case the first conductive layer is gold, the thickness of the first conductive layer may for example 50 nm. On the other hand, if the first conductive layer is PEDOT/PSS, the thickness may for example be 100 nm.

After deposition, the first conductive layer is patterned to form a gate electrode 13. This may be done by for example standard photolithography. The photolithography process comprises the following subsequent steps. First, a photoresist layer is applied on top of the first conductive layer, e.g. by means of spincoating. The photoresist layer may for example have a thickness of a few μm an may be made of any suitable polymer that can be used as a photoresist such as for example poly(vinyl cinnamate) or novolak-based polymers. Thereafter, a mask is applied to align a pattern onto the substrate 11. The photoresist layer is then illuminated through the mask e.g. by means of UV light. After illumination, the photoresist is developed by which either the illuminated parts of the photoresist (positive resist) or the non-illuminated part of the photoresist (negative resist) are removed, depending on which type of photoresist has been used. Patterning of the first conductive layer is then performed using the developed photoresist layer as a mask, after which the remaining parts of the photoresist layer are removed, typically by using an organic solvent. The result is shown in FIG. 3.

In case the first conductive layer is a conducting polymer layer, patterning can be done photolithographically, using the procedure described by Touwslager et al. [Touwslager, F. J., Willard, N. P., & de Leeuw, D. M. I-line lithography of poly-(3,4-ethylenedioxythiophene) electrodes and application in all-polymer integrated circuits *Appl. Phys. Lett.* 81, 4556-4558 (2002)] and Gelinck et al. [G. H. Gelinck et al., *Appl. Phys. Lett.*, 77, 1487 (2000).] Patterning can also be done using non-lithographic techniques known in the art, such as for instance silk-screen printing, inkjet printing in case of soluble conducting polymers, or for instance microcontact printing in case of gold, or for instance microembossing in case of ITO.

Figure 4:
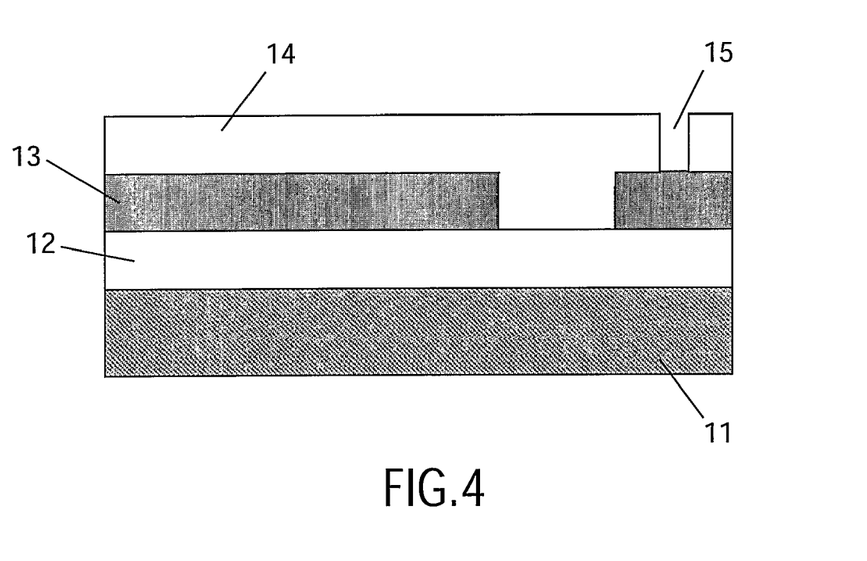

In a subsequent fabrication step, which is illustrated in FIG. 4, an organic ferroelectric layer 14 is deposited on top of the gate electrode 13. The organic ferroelectric layer 14 may be applied by means of for example spincoating from a solvent such as for example acetone, 2-butanone, cyclohexane, dimethylsulfoxide (DMSO) or dimethylformamide (DMF). Furthermore, deposition of the organic ferroelectric layer 14 may be performed by: drop casting, Doctor Blade, lamination of a prefabricated composite film, spraying or printing. The organic ferroelectric layer 14 may have a thickness of for example 2000 nm or lower, preferably the organic ferroelectric layer 14 has a thickness lower than 500 nm. The ferroelectric layer 14 may for example be triglycine sulphate (TGS) or may be a ferroelectric polymer or oligomer layer based on random copolymers of vinylidenedifluoride (VDF) with trifluoroethylene (TrFE) or with chlorotrifluoroethylene and other fluorinated polymers, or more general the ferroelectric polymer or oligomer layer 14 may be a halogenated polymer. However, for the processing of memory devices, fluorinated polymers seem to have the most beneficial properties, because for memory applications it is important that the remnant polarization $P_r$ of the ferroelectric polymer is as high as possible. Hence, materials having a high density of large dipole groups are preferred such as is the case in fluorine containing polymers, which have a remnant polarization >10 $mC/m^2$, for example ~100 $mC/m^2$. Another important reason for $P_r$ not to be too low is that the stability of the stored of states (polarizations) will be at least partly dependent on it. In this respect also the coercive field is important. A too high $E_c$ results in high switching voltages (generally $2 \times E_c \times$layer thickness for polarization saturation). However, a too low $E_c$ may result in manifestation of detrimental polarization fields within the capacitors when connected to other circuitry having parasitic capacitance. Furthermore, the thermal window wherein the polymers have their ferroelectric effect is very advantageous for the fluorinated polymers in order to be used for memory function. Thus, although other polymers or molecules exist, the fluorine containing materials seem to have the most beneficial properties, if the device formed is meant for memory applications.

The fluorinated polymer may preferably be a main chain polymer. However, the fluorinated polymer may also be a block copolymer or a side chain polymer. The fluorinated polymer may for example be $(CH_2-CF_2)_n$, $(CHF-CF_2)_n$ $(CF_2-CF_2)_n$ or combinations thereof to form (random) copolymers such as for example: $(CH_2-CF_2)_n-(CHF-CF_2)_m$ or $(CH_2-CF_2)_n-(CF_2-CF_2)_m$.

Other ferroelectric polymers may be used such as for example odd numbered nylons, cyanopolymers (polyacrylonitriles, poly(vinylidene cyanide) and the polymers with a cyano group in the side chain), polyureas, polythioureas and polyurethanes. All polymers may be used in pure form or diluted within another (polymer) matrix.

Ferroelectric materials are discussed in "Principles and Applications of Ferroelectrics and related materials", M. E. Lines and A. M. Glass, Oxford Press, 2001. A list of polymeric ferroelectric materials can be found in 'Ferroelectric polymers, chemistry, physics and applications', edited by Hari Singh Nalwa, Marcel Dekker, Inc 1995.

Figure 5:
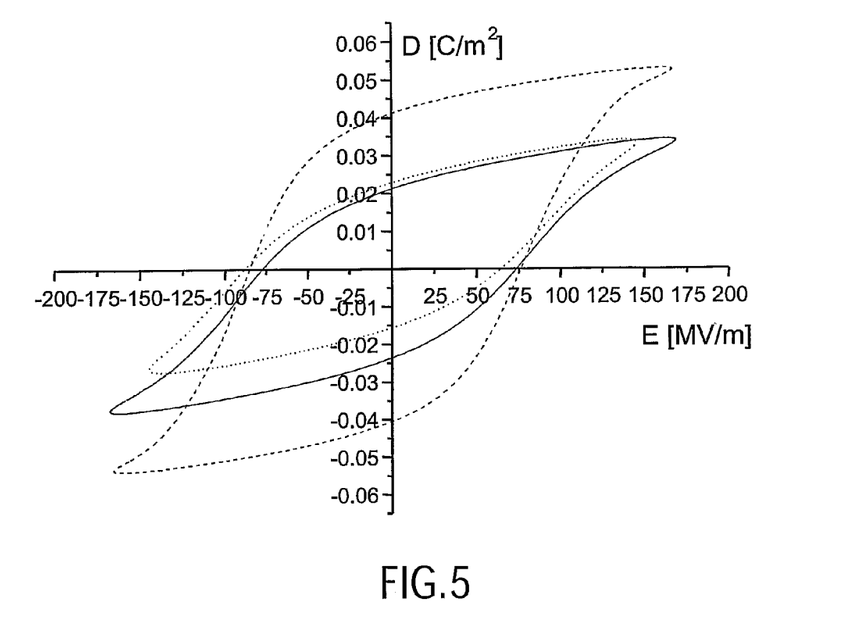
FIG. 5 is a graph illustrating ferroelectric hysteresis loops before crosslinking and after crosslinking.
Figure 6:
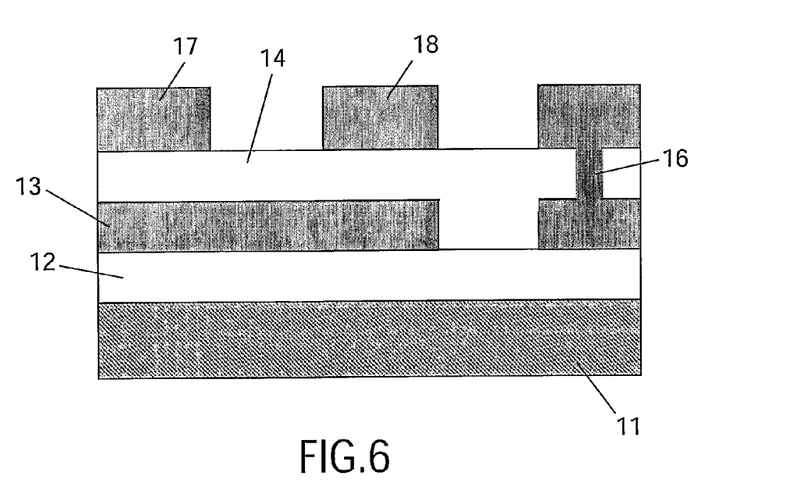

The organic ferroelectric layer 14 may then be patterned to form contact holes 15 to the first conductive layer where necessary (FIG. 4). If possible, and this depends on the kind of material used for the ferroelectric layer 14, the patterning may be carried out by means of standard photolithography as discussed above. However, in case the organic ferroelectric layer 14 is based on fluorinated polymers, application of standard photolithography for patterning is difficult, because a fluorinated polymer dissolves in the polar organic solvents commonly used to remove the photoresist, which results in a complete lift off of all layers on top. Therefore, in that case, the organic ferroelectric layer 14 may yet be patterned by means of standard photolithography by addition of a radiation crosslinking agent, such as a photosensitive crosslinking agent, which may for example be a diazocompound or a bisazide compound, to the fluorinated polymer spincoat solution. After spincoating of the ferroelectric polymer layer 14 with the cross-linker, the ferroelectric layer 14 is irradiated with UV light through a mask which leads to a partially non-soluble layer. Instead of spin-coating other suitable application methods can be used such as silk-screen printing or ink jet printing. Non-solubility of the organic ferroelectric layer 14 is accomplished by means of crosslinking of the polymer. The parts of the ferroelectric polymer layer 14 which are not illuminated, and which thus do not cross-link, may be subsequently removed by washing with a suitable solvent, such as an organic solvent, for example acetone, leaving a patterned film that may be annealed at 130-145° C. to increase the ferroelectric properties of the layer 14. The annealing temperature depends on the exact polymer composition. For example, in case of VDF/TrFE, the annealing temperature depends on the ratio of VDF and TrFE. Ferroelectric hysteresis loops may then be measured with for example a Sawyer-Tower set-up at 10 Hz sinusoidal voltage. The ferroelectric hysteresis loops, before crosslinking (graph 1 in FIG. 5) and after crosslinking (graphs 2 and 3 in FIG. 5) are compared in FIG. 5. In the latter case, hysteresis loops both with annealing (graph 2 in FIG. 5) and without annealing (graph 3 in FIG. 5) are shown. From FIG. 5 it is clear that annealing almost doubles the remnant polarization $P_r$, which corresponds to the state the memory cell resides in when the voltage of the power source is turned off. The crosslinking does not substantially alter the ferroelectric switching behavior; while $E_c$ is unaffected, $P_r$ decreases slightly. However, it greatly improves stack integrity, because upon further processing the crosslinked organic ferroelectric layer 14 will not dissolve. After patterning the organic ferroelectric layer 14, a second conductive layer is deposited on top of the patterned organic ferroelectric layer 14. The second conductive layer also fills the contact holes 15 formed in the organic ferroelectric layer 14, thus forming a vertical interconnect 16. This is illustrated in FIG. 6. The second conductive layer may have the same thickness as the first conductive layer. Again, the thickness of the second conductive layer to be used depends on the required sheet resistance for the application envisioned and the specific resistance of the material that is used. The second conductive layer may for example be a metal layer (e.g. gold, ITO), a semiconducting layer, a conducting polymer layer (e.g. be polyaniline doped with camphor sulfonic acid (PANI/CSA) or poly(3,4-ethylenedioxythiophene) doped with poly(4-styrenesulfonaat) (PEDOT/PSS)), or may be any suitable conductive material layer. The material of which the first and second conductive layers are formed should be such that it is possible to construct low-ohmic vertical interconnects 16.

Deposition of the second conductive layer may be done by means of any suitable deposition technique, depending on the material that has been used, such as for example chemical vapour deposition (CVD), spincoating, dropcasting, doctor blade, lamination of a prefabricated composite film, etc.

However, if the second conductive layer is a conductive polymer layer that has to be spincoated onto the organic ferroelectric layer 14, the aqueous solution, from which the polymer layer is deposited, requires modification of the spincoating solution, because spincoating of the second conductive layer from a aqueous solution onto the organic ferroelectric layer 14 results in severe dewetting. This may be overcome by improving the wettability properties of the spincoating solution through addition of a surface tension reducing agent, which may be any solvent that is miscible with water, evaporates slower than water and does not attack the organic ferroelectric layer 14 within the time period of the processing of the device. Examples of wetting agents which may be used in the present invention are for example n-butanol, an amine or a soap like reagent. Wetting agents comprising an amine preferably have a structure comprising an amine at one side and a polar group at the other side. The polar group then makes the surface hydrophobic. The polar group may for example be an OH group. Specific examples of amines which may be used in the present invention may for example be amino-alcohols such as e.g. 6-amino-1-hexanol or 6-amino-1-dodecanol. Compounds with other polar groups may also be used, such as for example a carboxylic acid as long as they do not easily dissociate. Soap like reagents which may be used in this invention are soaps comprising groups which form hydrogen bridges with the organic ferroelectric polymer 14, such as e.g. sulfoxides.

Patterning of the second conductive polymer layer may be carried out by means of for example standard photolithography as described earlier. By patterning the second conductive polymer layer a source 17 and a drain 18 electrode are formed (FIG. 5).

Figure 7:
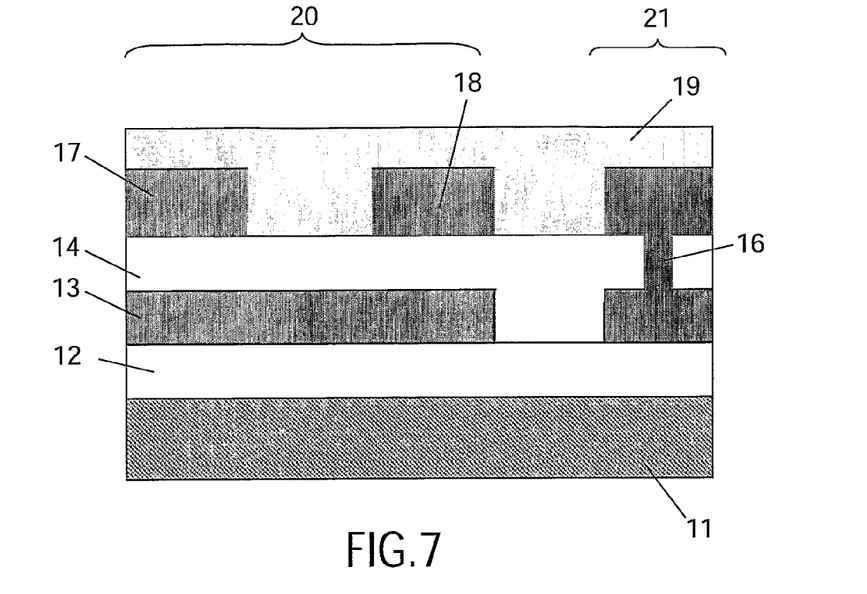

In a further step, which is illustrated in FIG. 7, the memory device 30, formed by means of the present invention, is completed by depositing an organic ambipolar semiconductor layer 19 on top of the source 17 and the drain 18 electrode. The organic ambipolar semiconductor layer 19 may for example comprise a layer in which p- and n-type organic semiconductors are intimately mixed by which the drawback of switching polarization in depletion, which appears in the prior art devices, is circumvented, since now both polarization states of the ferroelectric gate can be compensated for by accumulation charges; one with holes accumulated in the p-type part of the organic ambipolar semiconductor layer 19 and the other by accumulation of electrons within the n-type part of the organic ambipolar semiconductor layer 19. Suitable organic ambipolar semiconductor layers 19 that may be used in the present invention are blends of n- and p-type organic semiconductors such as for example a mixture of [6,6]-phenyl C61 butyric acid methyl ester (PCMB) and poly[2-methoxy, 5-(3,7)dimethyl-octyloxy]-p-phenylene vinylene (OC1OC10-PPV), a single polymeric semiconductor such as for example poly(3,9-di-tert-butylindeno[1,2-b]fluorene) (PIF)) or a double layer-stack of p-type and n-type semiconductors, wherein two active semiconductors may be used.

The organic ambipolar semiconductor layer 19 may be patterned, but this is step is not necessary. However, patterning of the organic ambipolar semiconductor layer 19 may be performed in order to reduce leakage currents. Hence, whether or not patterning is performed depends on the application requirements.

FIG. 7 shows the memory device 30, processed according to the present invention. The device 30 comprises a transistor 20 and a via 21. The transistor 20 comprises a gate electrode 13 and source 17 and drain 18 electrodes. An organic ferroelectric layer 14 is sandwiched in between the gate electrode 13 and the source 17 and drain 18 electrodes.

The use of an ambipolar blend results in improved memory effects. This manifests itself in larger memory windows, larger current ratio between the "0" and the "1" state, facilitating read-out operation. It also may result in faster switching times when device speed is limited by the RC time of the semiconducting channel 30. In case of ambipolar devices, switching occurs in both polarities in accumulation. This makes it possible to optimise on-current and off-current independently.

Figure 8:
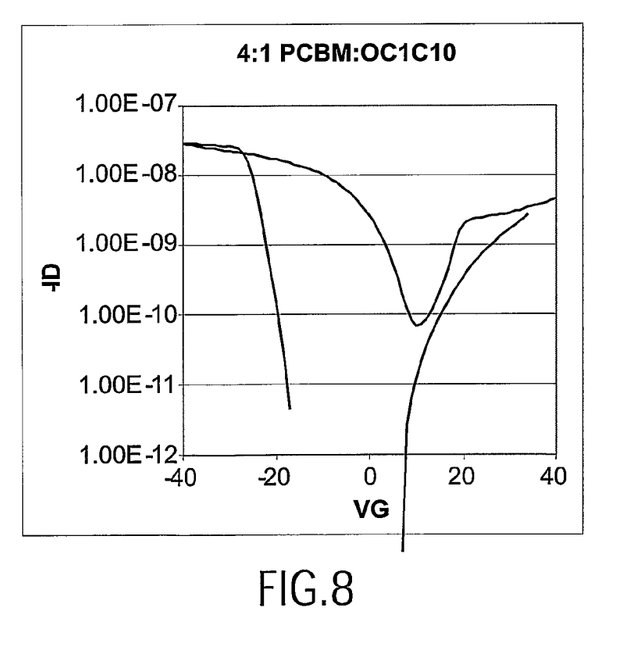
FIG. 8 shows hysteresis on a Id-Vg characteristic (or hysteretic transfer curve) of a blend of OC1OC10-PPV and PCBM based ferroelectric transistor recorded on a device with a channel length/channel width=$4/1000$ μm.

In FIG. 8 the Id-Vg characteristics of a blend of OC1OC10-PVV and PCMB based ferroelectric transistor. The gate bias was swept from +40V to −40V and back at a constant scan speed of 1 V/s. The application of a large voltage to the gate sets the direction of the polarization, and hence the value of the drain current of the transistor at VG=0. These, hysteric transfer curves may be repeated several times, e.g. 10 times, with only small degradation.

In a specific embodiment of the present invention a non-volatile ferroelectric memory device 30 as described in the first embodiment is formed by using PEDOT/PSS for the first and second conductive layers and P(VDF/TrFE) is used for the organic ferroelectric layer 14. The manufacturing process of the device of this specific embodiment is analogous as described in the first embodiment of this invention. The device 30 such formed may be combined with any suitable organic ambipolar semiconductor layer 19. However, in a specific example of this embodiment, the organic ambipolar semiconductor layer 19 may be a single polymeric semiconductor. In that way, an all-polymer non-volatile memory device may be processed using the method of the present invention. Hence, the method of the present invention may be used in the manufacturing of all-polymer devices.

In another specific embodiment a mixture of [6,6]-phenyl C61 butyric acid methyl ester (PCMB) and poly[2-methoxy, 5-(3,7) dimethyl-octyloxy]-p-phenylene vinylene (OC1OC10-PPV) may be applied as an organic ambipolar semiconductor layer 19. The above mentioned mixture may be prepared by dissolving a mixture of PCMB and OC1OC10-PPV, with a ratio of 4:1, in chlorobenzene. The weight content is about 0.5%. The solution was stirred for 1 hour at 80° C., cooled down to room temperature and then spincoated onto the patterned second conductive polymer layer. The hysteresis loop of a ferroelectric transistor based on a blend of PCMB and OC1OC10-PPV (channel length/channel width $^4/_{1000}$ μm) is shown in FIG. 8.

Figure 9:
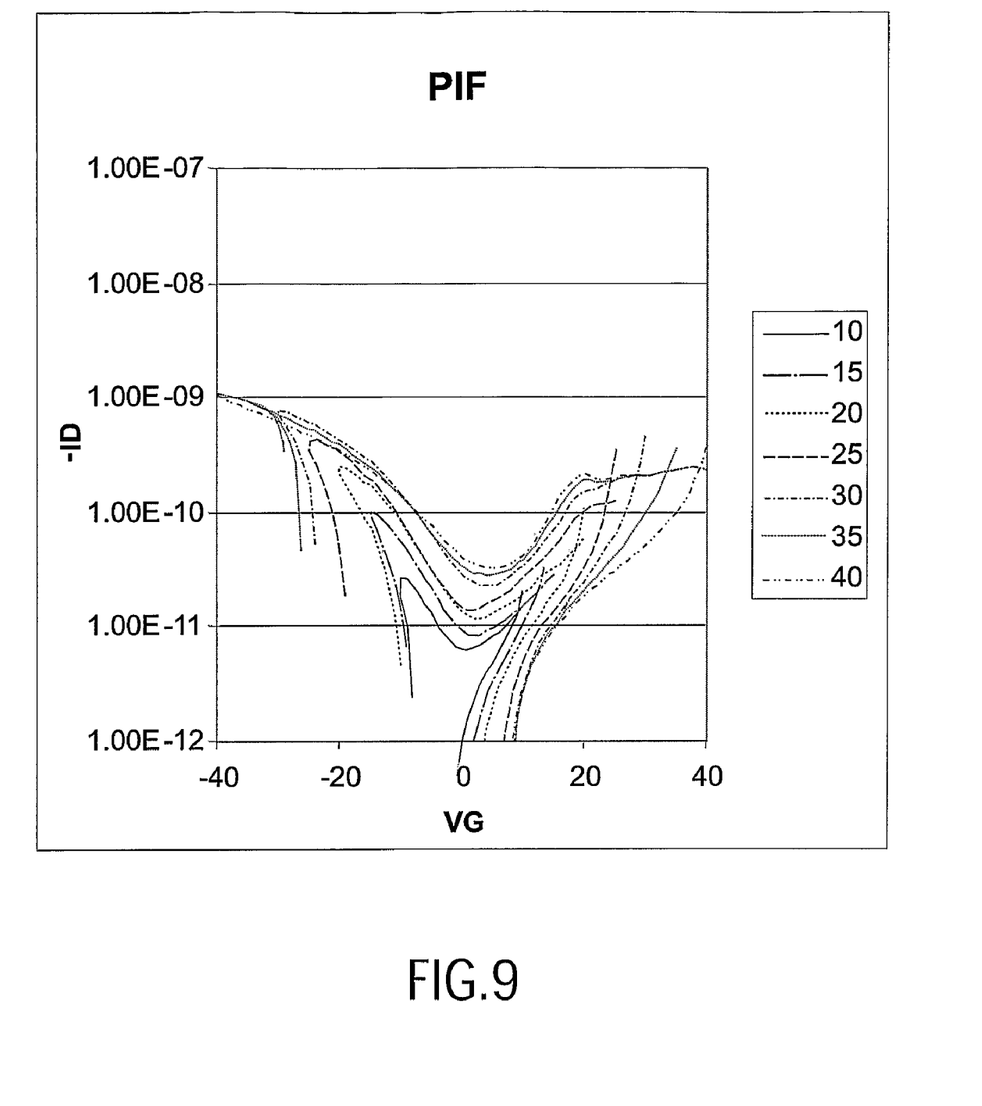
FIG. 9 shows hysteresis on Id-Vg characteristics of a ferroelectric transistor based on poly(3,9-di-tert-butylindeno[1,2-b]fluorene) (PIF).

In yet another specific embodiment, an ambipolar transistor based on a single organic semiconductor is provided. The organic ambipolar semiconductor layer 19 used in this embodiment is poly(3,9-di-tert-butylindeno[1,2-b]fluorene) (PIF). Id-Vg hysteresis loops of the PIF based transistor for different gate voltage ranges is shown in FIG. 9. The Id currents are low as a result of the low electron and hole mobility, nevertheless there is a clear evidence of the memory effect, and switching occurs at both polarities. The use of a single material has, with respect to the use of a blend op n- and p-type material, the advantage that phase segregation of the p- and n-type components cannot occur.

An advantage of the device 30 according to the first and second embodiment of the present invention is that, since all layers may be processed from a solution, easy processing and a low cost technology is achieved. Including a mask to pattern the organic ambipolar semiconductor layer 19, the whole process consists of only four mask sets. Since the maximum processing temperature is below 150° C., this technology is compatible with the use of flexible substrates such as for example polymer substrates.

A further advantage may be found in the fact that the dielectric constant of ferroelectric organic materials, such as for example P(VDF/TrFE), is about three times larger compared to conventional photoresists which are used in the prior art. Hence, driving voltages are reduced resulting in for instance lower power dissipation.

The improved memory effect and switching, described in the above embodiments, are independent of the material of the organic ferroelectric layer 14 which is being used in combination with the organic ambipolar semiconductor layer 19.

The memory window of the device 30 depends on the ratio of electron current and hole current. For ratio's close to 0 or 1 the memory window is largest. In the exceptional case that these currents are exactly symmetrical with respect to Vg=0, then read out at Vg=0 is not possible, and read out of the memory state should be done at Vg≠0 and whereby Vg is smaller than the switching field.

It is to be understood that although preferred embodiments, specific constructions and configurations, as well as materials, have been discussed herein for devices according to the present invention, various changes or modifications in form and detail may be made without departing from the scope and spirit of this invention.

A non-volatile ferroelectric memory device is proposed which comprises a combination of an organic ferroelectric polymer with an organic ambipolar semiconductor. The devices of the present invention are compatible with—and fully exploit the benefits of—polymers, i.e. solution processing, low-cost, low temperature layer deposition and compatibility with flexible substrates.

The invention claimed is:

1. A non-volatile memory device comprising:
   an organic ambipolar semiconductor layer in contact with at least two sides of a first electrode and a second electrode; and
   an organic ferroelectric layer in contact with one side of each of the first electrode and the second electrode and at least two sides of a control electrode, said organic ambipolar semiconductor layer and said organic ferroelectric layer being at least partially in contact with each other.

2. The non-volatile memory device according to claim 1, wherein the control electrode is formed in a first conductive layer.

3. The non-volatile memory device according to claim 2, the control electrode being separated from said organic ambipolar semiconductor layer by said organic ferroelectric layer.

4. The non-volatile memory device according to claim 2, wherein the first electrode and the second electrode are formed in a second conductive layer, said first and said second electrodes being separated from each other by material of the organic ambipolar semiconductor layer, and said first and said second electrodes being separated from said control electrode by said organic ferroelectric layer.

5. The non-volatile memory device according to claim 4, wherein the second conductive layer is a conductive polymer layer.

6. The non-volatile memory device according to claim 5, wherein the conductive polymer layer is a PEDOT/PSS layer or a PANI layer.

7. The non-volatile memory device according to claim 2, wherein the first conductive layer is a conductive polymer layer.

8. The non-volatile memory device according to claim 7, wherein the conductive polymer layer is a PEDOT/PSS layer or a PANI layer.

9. The non-volatile memory device according to claim 1, wherein the organic ferroelectric layer is a ferroelectric polymer or oligomer layer.

10. The non-volatile memory device according to claim 9, wherein the ferroelectric polymer or oligomer layer is a layer comprising material selected from: $(CH2-CF2)_n$, $(CHF-CF2)_n$, $(CF2-CF2)_n$ or combinations thereof to form (random) copolymers including $(CH2-CF2)_n-(CHF-CF2)_m$ or $(CH2-CF2)_n-(CF2-CF2)_m$.

11. The non-volatile memory device according to claim 1, wherein the organic ambipolar semiconductor layer comprises a mixture of an n-type and a p-type semiconductor material.

12. The non-volatile memory device according to claim 11, wherein the organic ambipolar semiconductor layer comprises a mixture of [6,6]-phenyl C61 butyric acid methyl ester and poly[2-methoxy,5-(3,7)dimethyl-octyloxy]-p-phenylene vinylene.

13. The non-volatile memory device according to claim 1, wherein the organic ambipolar semiconductor layer comprises a single organic material.

14. The non-volatile memory device according to claim 13, wherein the single organic material is poly(3,9-di-tert-butyl-indeno[1,2-b]fluorene).

15. The non-volatile memory device according to claim 1, the memory device comprising a memory window, whereby said memory window depends on a ratio of electron current and hole current.

16. The non-volatile memory device according to claim 15, whereby said ratio of electron current and hole current is close to 0 or close to 1.

17. A method for processing a non-volatile memory device, the method comprising acts of:
   forming an organic ferroelectric layer in contact with at least two sides of a first electrode and a second electrode; and
   forming an organic ambipolar semiconductor layer in contact with one side of each of the first electrode and the second electrode and at least two sides of a control electrode, said organic ambipolar semiconductor layer and said organic ferroelectric layer being at least partially in contact with each other.

18. A non-volatile memory device comprising:
   first and second electrodes;
   a control electrode;
   an organic ambipolar semiconductor layer in contact with three sides of said first and second electrodes; and
   an organic ferroelectric layer in contact with one side of each said first and second electrodes, at least two sides of said control electrode and at least partially in contact with said organic ambipolar semiconductor layer.

19. The device of claim 18, further comprising a planarization layer in contact with one side of said control electrode.

* * * * *